United States Patent [19]
Bauer

[11] Patent Number: 5,486,320
[45] Date of Patent: Jan. 23, 1996

[54] METHOD OF DEPOLARIZING A FERROELECTRIC MATERIAL USING ELECTRICAL MEANS AND ITS APPLICATION TO OBTAIN A FERROELECTRIC MATERIAL OF REINFORCED DIELECTRIC STRENGTH

[75] Inventor: François Bauer, Saint-Louis, France

[73] Assignee: Institut Franco-Allemand de Recherches de Saint-Louis, Saint-Louis Cedex, France

[21] Appl. No.: 177,544

[22] Filed: Jan. 5, 1994

[30] Foreign Application Priority Data

Jan. 6, 1993 [FR] France .................................. 93 00061

[51] Int. Cl.⁶ .................................................... B29C 71/04
[52] U.S. Cl. .................. 264/408; 425/169; 425/174.8 R; 425/174.8 E
[58] Field of Search .......................... 264/22, 25; 425/174, 425/169, 174.8 R, 174.8 E; 361/233; 29/25.35; 365/145; 252/62.9

[56] References Cited

U.S. PATENT DOCUMENTS 3,943,614  3/1976  Yoshikawa et al. ....................... 264/22
4,241,128  12/1980  Wang ....................................... 264/22
4,308,370  12/1981  Fukada et al. .......................... 264/22
4,611,260  9/1986  Bauer ....................................... 264/22
4,684,337  8/1987  Bauer ....................................... 264/22
5,310,511  5/1994  Marcus ..................................... 264/22

FOREIGN PATENT DOCUMENTS 0109120  5/1984  European Pat. Off. ..
0186534  7/1986  European Pat. Off. ..
2538157  6/1984  France .

Primary Examiner—Mathieu D. Vargot
Attorney, Agent, or Firm—Young & Thompson

[57] ABSTRACT

An electrical procedure depolarizes completely or partially a ferroelectric material which had been polarized before in at least one of its regions. A low-frequency alternating electric field is applied to the material whose amplitude exceeds the coercive field $E_c$ and is then decreased step by step. In a preferred embodiment the selected maximum value is 1.3 times that of the coercive field $E_c$. It is also possible to depolarize the material selectively so that there are polarized zones remaining. The procedure may be applied to produce materials for piezoelectric or pyroelectric transducers as well as to obtain materials with improved dielectric strength.

11 Claims, 5 Drawing Sheets

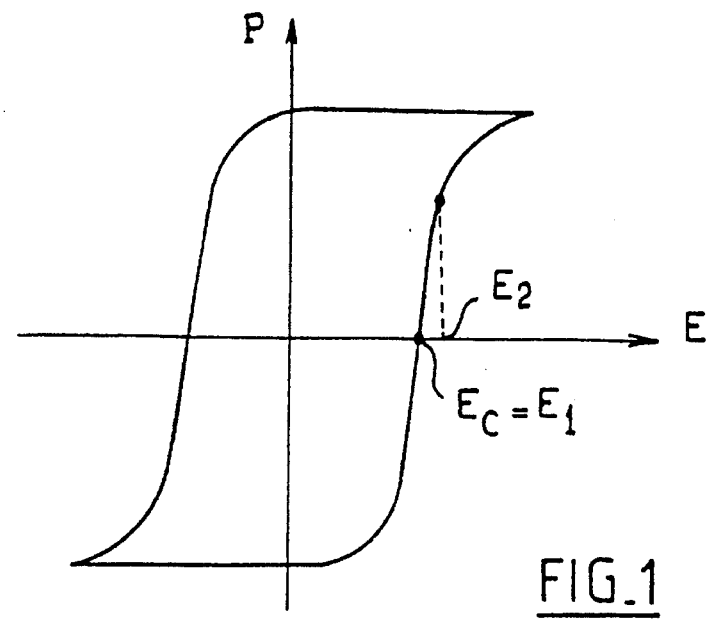
FIG_1
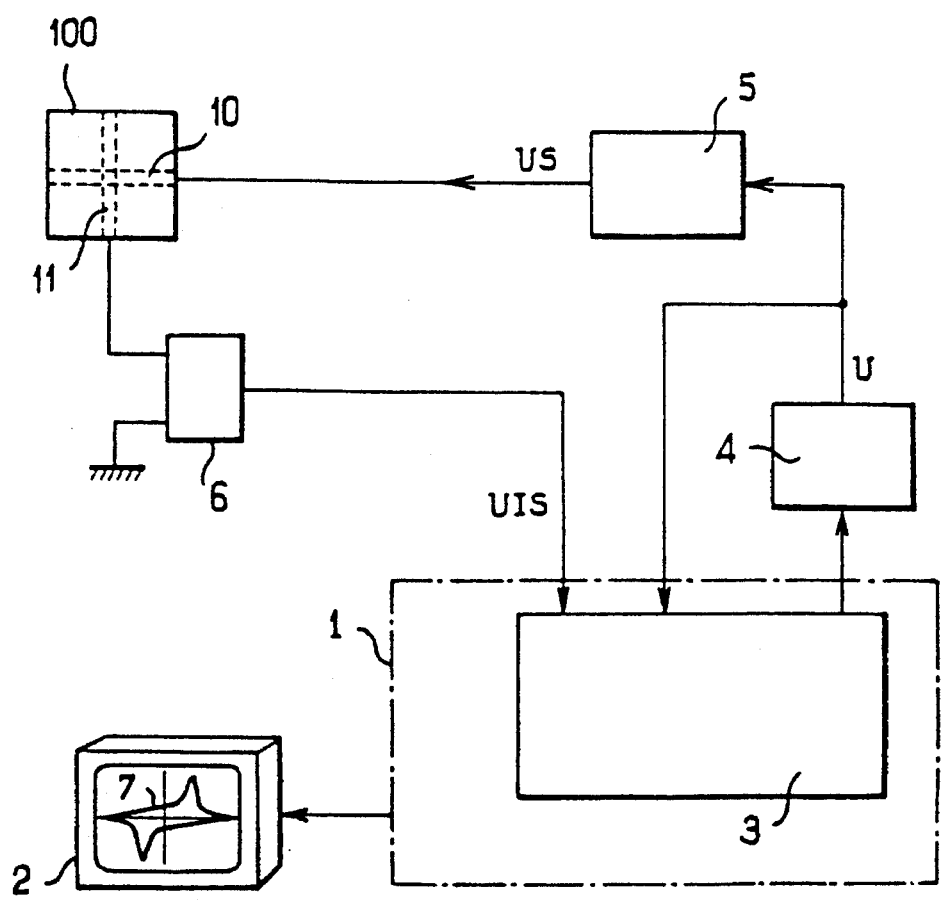
FIG_2

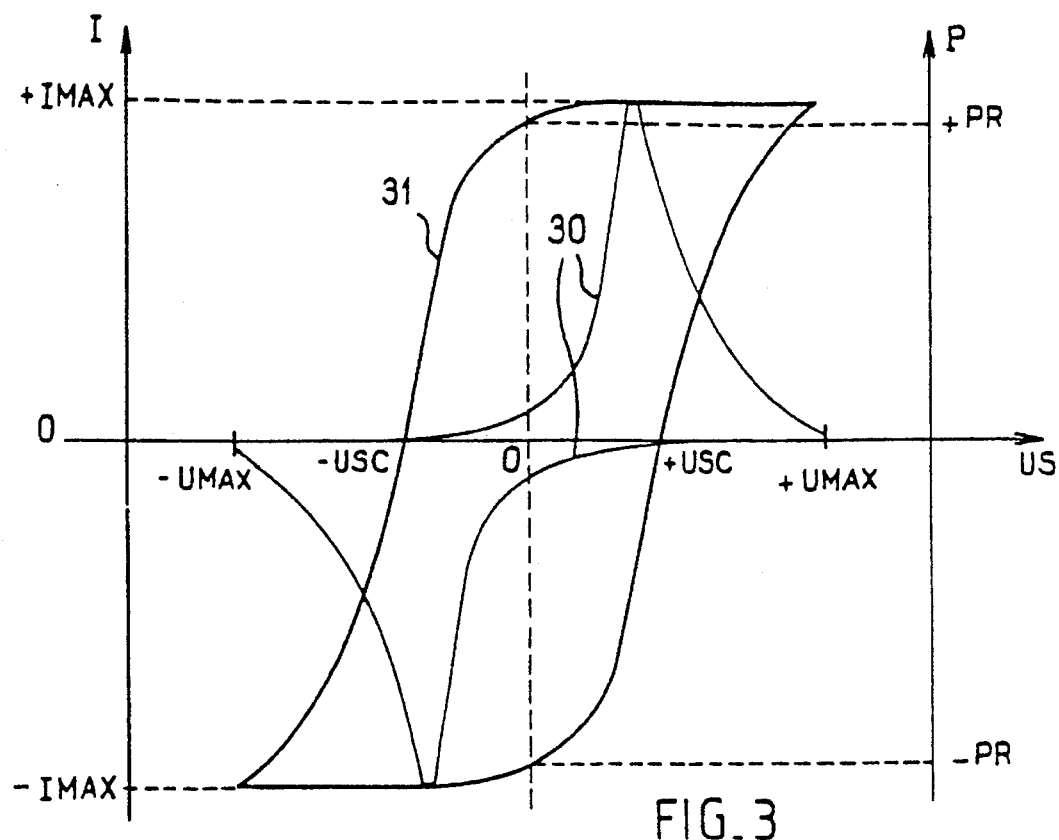
FIG_3
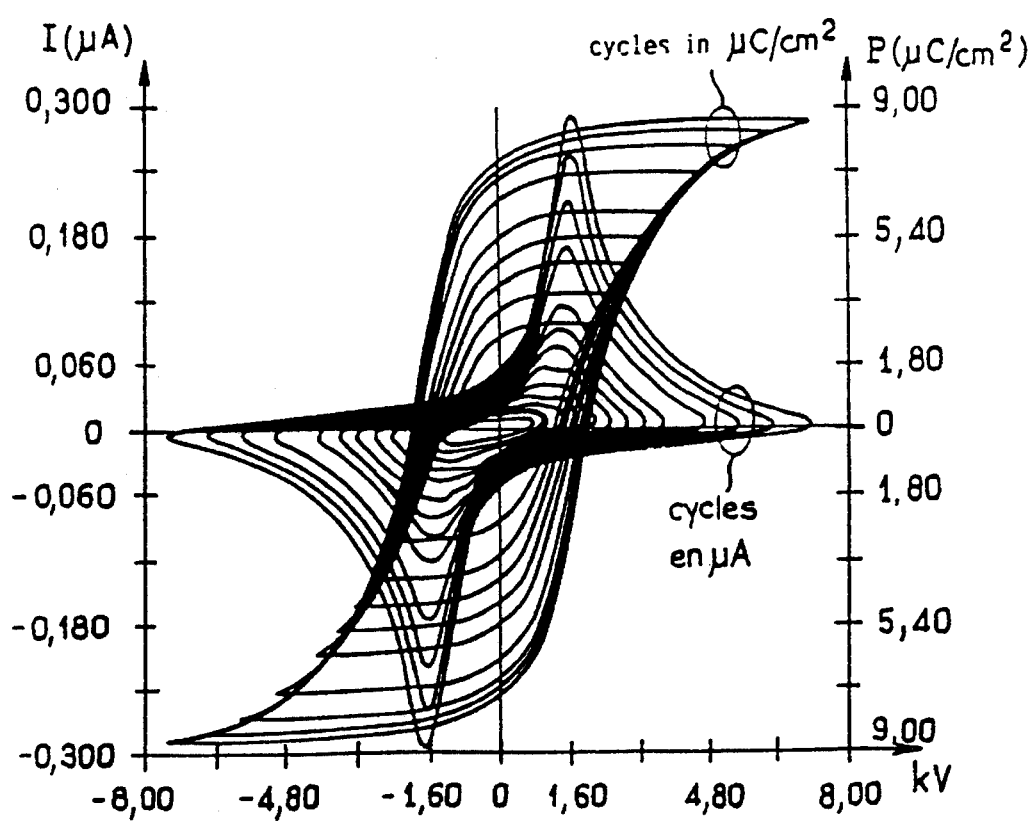
FIG_4

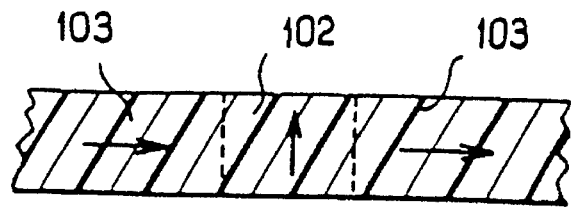
FIG_7
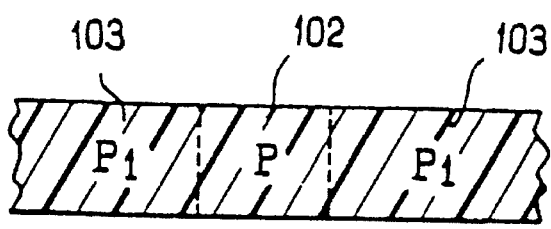
FIG_8
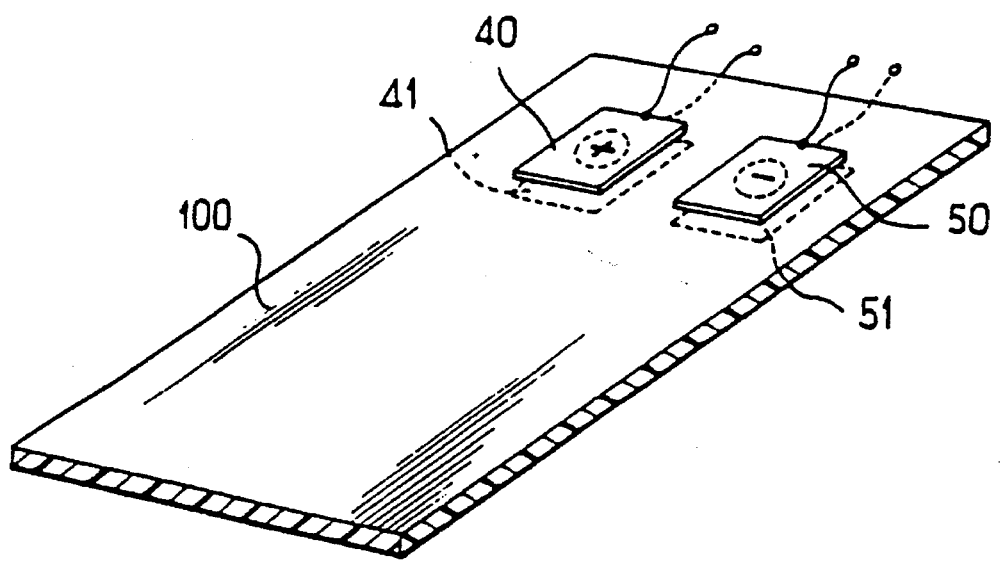
FIG_10

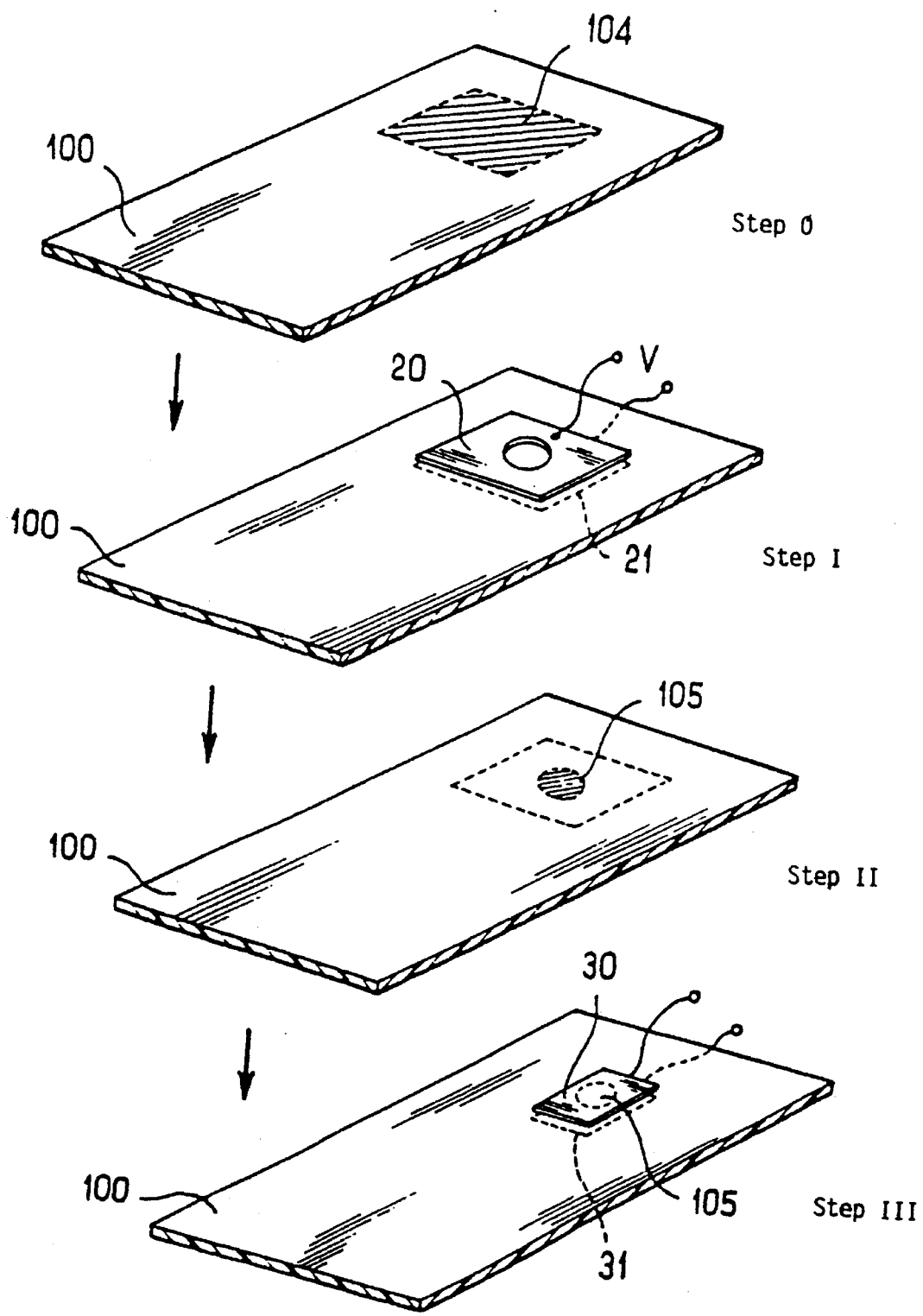
FIG_9

5,486,320

METHOD OF DEPOLARIZING A FERROELECTRIC MATERIAL USING ELECTRICAL MEANS AND ITS APPLICATION TO OBTAIN A FERROELECTRIC MATERIAL OF REINFORCED DIELECTRIC STRENGTH

BACKGROUND OF THE INVENTION

1. Field of the Invention

The present invention relates to a method of depolarizing a ferroelectric material using electrical means.

As regards this invention the term depolarization will be used to indicate a complete depolarization or a partial depolarization of the said material.

The ferroelectric materials which can be used are for example PVDF (polyvinylidene fluoride), terpolymers or certain copolymers like $VF_2/VF_3$. In a more general way these materials are crystals, polycrystals, polymers or copolymers.

The invention also relates to a procedure to depolarize certain zones of a ferroelectric material selectively, as for example zones of a film or a foil of such a material.

Advantageously, this procedure applies to the production of materials used for different kinds of sensors: piezoelectric pressure gages, pyroelectric transducer etc. In particular, it will be possible to adopt various configurations, as for example a matrix configuration. This configuration can be obtained by depolarizing the whole surface of a foil of ferroelectric material which had been polarized before with the exception of those zones which are regularly distributed according to said matrix configuration.

Finally the invention relates to a procedure which can be used to obtain ferroelectric materials of reinforced dielectric strength.

2. Description of Related Art

It is of course necessary to polarize a ferroelectric material before it can be depolarized completely or partially. Various polarization methods are known.

The applicant has described a method and a facility to polarize ferroelectric materials in the French patent application FR-A-2 538 157. The findings of this invention can well be used in the context of the present invention. According to the described method an alternating electric field of low frequency is applied to the ferroelectric material, and then the amplitude of this field is progressively increased in such a way that there is a controlled residual polarization left in the material It is also possible to determine the hysteresis loop: polarization P as a function of the electric field E.

The enclosed FIG. 1 illustrates such a hysteresis loop which is also shown, for example, in FIG. 4B of the above-mentioned patent application.

The polarization of the material can theoretically be set to zero by applying a field $E_1=E_c$ where E is the coercive field strength. The polarization can as well be decreased without setting it to zero if a field $E_2$ is applied where $E_2>E_c$. These values are of course positive or negative in conformity with the initial polarization.

However, this method is not very precise. In fact, the coercive field strength $E_c$ and the hysteresis loop are dependent on the thickness of the material. This thickness is not uniform and the field strength $E_c$ varies as a function of the field. In addition, a ferroelectric material as for example PVDF or $VRF_2$ is never homogeneous. As a consequence the achieved depolarization can never be complete or it is not complete in a reproducible way.

In addition, the induced electric field is anisotropic in the material which is of a semicrystalline type in the example considered.

If a specific partial depolarization shall be achieved, it will be even more difficult to determine the value of the field $E_2$ to be applied. This is in particular due to the slope of the hysteresis loop.

The invention aims at reducing the disadvantages of the existing methods which have just been described.

SUMMARY OF THE INVENTION

One of the objectives of the invention is to depolarize a prepolarized ferroelectric material in a safe and reproducible way with the piezoelectric response being zero parallel to the axis of the initial polarization.

Another objective of the invention is to decrease the polarization of a prepolarized material under the same conditions of safety and reproducibility if this is required by the application.

Another objective of the invention is to depolarize partially or completely and in a selective way specific zones of a prepolarized material or—which is the inverse effect of the procedure—to leave certain zones of this same material polarized while the other zones are depolarized.

Finally, it was surprisingly found that a ferroelectric material which had been polarized in a first phase and then depolarized completely according to the method of the invention exhibited an improved dielectric strength after this last phase, i.e. that it had a higher dielectric strength than in its initial state prior to polarization.

Consequently the invention also aims at obtaining such a ferroelectric material.

Thus it is the purpose of the invention to present a method to depolarize a ferroelectric material by electrical means with the said material having been polarized during a previous phase in at least one of its regions along a specific axis. The method according to the invention is characterized by the fact that it comprises at least the following steps:

A low-frequency alternating electric field is applied to the material parallel to the specific axis with the maximum amplitude of the field exceeding the value of the coercive polarization field of the said material.

The said amplitude is progressively reduced to a specific minimum value of the amplitude of the applied electric field so that a predetermined value of remanent polarization of the said material is achieved.

In a preferred variant of the invention the maximum amplitude is set to a value which exceeds the value of the coercive field by 30%. To obtain a complete depolarization the process is repeated until the amplitude of the applied electric depolarization field equals zero.

Another subject matter of the invention is a method for the selective depolarization of a ferroelectric material.

Finally it is a subject matter of the invention to apply this method to obtain a ferroelectric material of reinforced dielectric strength.

BRIEF DESCRIPTION OF THE DRAWINGS

Reading the following description and referring to the enclosed figures the invention will be better understood and other characteristics and advantages will become evident.

The following figures are enclosed:

FIG. 1 is a diagram showing the hysteresis loop "polarization P as a function of the electric field E" of a polarized ferroelectric material.

FIG. 2 illustrates in a schematic way a setup which can be used to apply the procedure according to the invention.

FIG. 3 is a diagram showing two hysteresis loops obtained during a preliminary polarization phase of the ferroelectric material.

FIGS. 4 and 5 are diagrams illustrating two modes to implement the depolarization method according to the invention.

FIGS. 7 and 8 are drawings which illustrate the process shown in FIG. 6 in more detail.

FIG. 9 illustrates the various steps required to produce a sensor by means of a ferroelectric material which was obtained using the method of the invention.

FIG. 10 illustrates a particular sensor configuration using a ferroelectric material obtained by the method according to the invention.

DESCRIPTION OF THE PREFERRED EMBODIMENTS

Figure 5:
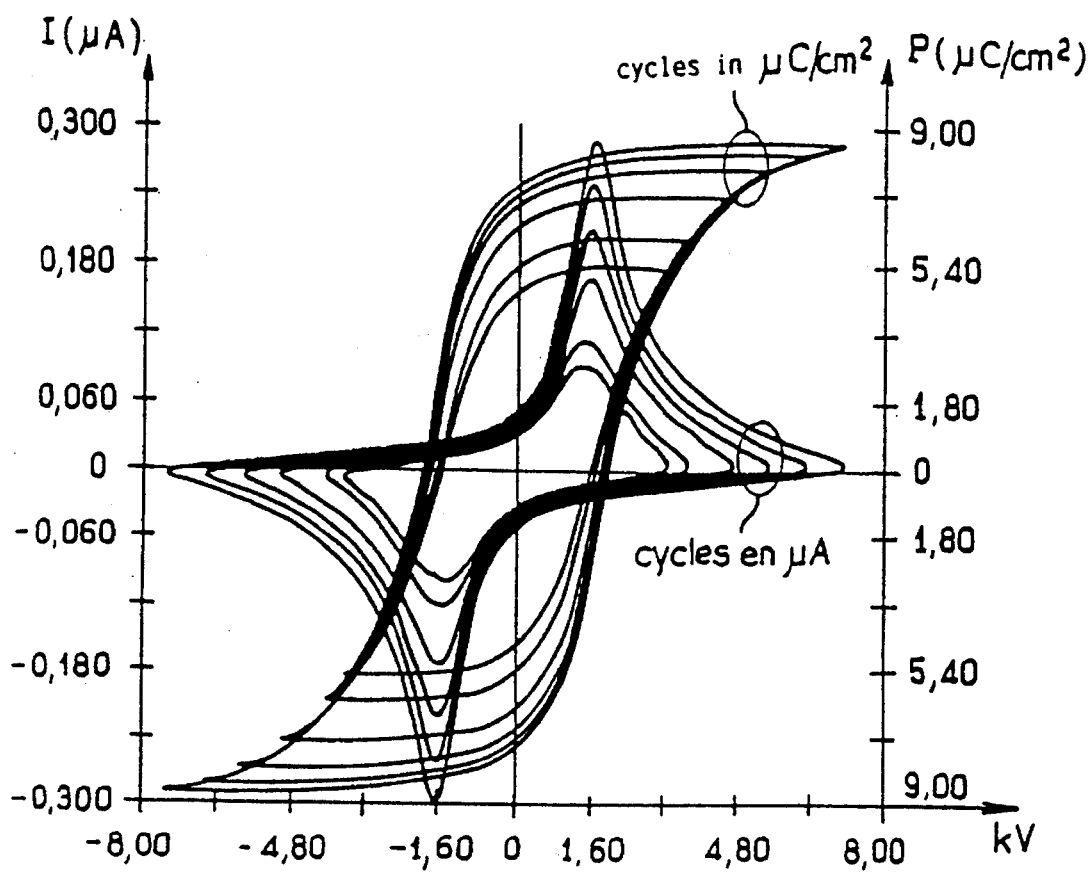

Unless otherwise indicated, it is assumed in the following description that the material is prepolarized, as for example in conformity with the method of the above-mentioned patent application.

The material which is generally an element of small thickness in relation to its other dimensions is according to this last assumption already equipped with electrodes which cover one or several polarized or active zones.

These electrodes can be used to apply an electric depolarization field in conformity with the provisions of the invention which will be explained in the following.

However, as was said before this method had certain disadvantages if the zones to be polarized were very small.

In general the process starts by depositing the measuring electrodes of the sensor on the two opposite surfaces of a foil of ferroelectric material. This is done for example by cathode sputtering, evaporation or any other known method. These electrodes are used to apply the alternating electric field during the polarization phase. The foil of ferroelectric material is generally compressed to reduce local volume variations which are caused by the higher values of the electric field during the polarization phase and tend to adversely affect the reproducibility of the sensor characteristics. In practice the pressure which can be exerted on the foil of ferroelectric material is limited to typically some hundred bars, otherwise there would be a deterioration of the ferroelectric material near the edges of the deposited electrodes or a deterioration of the electrodes themselves if they cover a relatively large area.

It is difficult to use the procedure described above to polarize a zone of reduced dimensions on a foil of ferroelectric material if the dimensions are typically below 1 mm on foil with a thickness of approximately 25 μm. These dimensions are given here of course for information only. In connection with these small dimensions the edge effects become significant or even preponderant and complicate the interpretation of current measurements. These edge effects also affect the homogeneity of the induced remanent polarization. The polarization is defined as the ratio of the quantity of charges and the geometrical surface. In addition, these small dimensions cause a high local stress which requires a pressure increase to limit its effect. This leads to the problems of mechanical strength which have been mentioned above.

To reduce the above-mentioned inconveniences as well as some others which have not been treated here, the applicant has submitted another French patent application together with the present patent application under the following title: "Procédé pour modifier la polarisation d'une zone d'une feuille de matériau ferroélectrique, et procédé pour réaliser un capteur piézo-électrique ou pyroélectrique" (A procedure to modify the polarization of a zone on a foil of ferroelectric material and a procedure to produce a piezoelectric or pyroelectric transducer).

According to this procedure the external electrodes are arranged in such a way on the two opposite surfaces of the foil of material to be polarized that the zone to be polarized extends between these two electrodes. The zone to be polarized is compressed and a variable voltage is applied across the electrodes.

Each of the said electrodes is connected to an insulating support whose surface area is larger than that of the zone to be polarized on the foil of ferroelectric material. Besides the electrode this insulator has a layer of dielectric material whose external surface is level with the external surface of the electrode.

Then the measurement electrodes are applied on the support of ferroelectric material using any appropriate method (deposition etc.) which is good practice.

Such a polarization method can therefore be used if the zones to be polarized are small or if electrodes have not been applied to the support of ferroelectric material before.

In the following description, which shall illustrate the underlying ideas of this invention without claiming completeness, it is assumed that the ferroelectric material is made of PVDF (polyvinylidene fluoride). Nevertheless other materials can also be used as has already been mentioned: crystals, polycrystals, polymers or copolymers.

At first a short description of a facility is given which can be used to perform the method according to the invention (see FIG. 2).

The facility of FIG. 2 comprises analog and digital circuits, but it is also possible to use an entirely analog system for the present invention, as for example that described in the above-mentioned patent application FR-A-2 538 157 on which the facility of this invention is based.

The facility of FIG. 2 comprises a computer, as for example a microcomputer (1) with a visual display unit (2). The microcomputer (1) is equipped with an interface and processing card (3) to control the procedure. This circuit card (3) controls a low-frequency generator (4) which generates a low-frequency sinusoidal voltage U with variable amplitude. This voltage U is coupled to the input of a voltage amplifier (5) which applies the amplified voltage US to one of the electrodes which rests on a support (100) of ferroelectric material. The other electrode (11) is grounded to zero potential. A current-voltage converter (6) is preferentially connected between the second electrode (11) and ground to measure the current flow IS in the ferroelectric material which is due to the application of the variable voltage US. Of course the current could also be measured at the first electrode (10), but as this electrode is referenced to a higher potential this measurement would cause technical problems. The measurement can be performed as is good practice, but the method shall not affect the current to be measured. The result of the measurement is transmitted to the circuit card (3) as voltage signal UIS which is proportional to the current IS. In addition, the circuit card (3) receives the voltage signal U which is proportional to the applied voltage US. The circuit card (3) contains analog-to-digital converters (not shown here) which convert the voltage signals U and UIS to digital signals representing the voltage US and the current IS in the ferroelectric material. These digital signals are then processed by the circuit card (3) so that the corresponding loops (7) can be displayed on the screen (2) of the microcomputer.

It should be noted that this facility can also be used in the preliminary polarization phase to perform the said polarization. In this case the electrodes (10, 11) serve either as external electrodes or as measuring electrodes according to the selected polarization method.

The method according to the patent application which has been submitted together with the present application will be shortly described below.

When the foil (100) is compressed, the circuit card (3) applies a control signal to the generator (4) so that the latter generates a voltage U with a very low frequency (some hundredths Hertz). The amplitude of this voltage is slowly increased by the amplifier (5) until it reaches a suitable value to apply an electric field across the electrodes (10, 11) whose field strength exceeds that of the coercive field E of the ferroelectric material to be polarized. During this phase the signals U and UIS representing the voltage US and the current IS in the zone to be polarized, i.e. the zone extending between the two electrodes (10, 11) are processed to extract the resistive component IR and the capacitive component IC of the current IS. The resistive component IR is calculated according to the formula IR=US/R where R designates the known internal resistance of the ferroelectric material. The capacitive component IC is calculated according to the formula IC=$\epsilon$ (dUS/dt) where $\epsilon$ designates the known permittivity of the ferroelectric material and the ratio (dUS/dt) designates the time derivative of the amplified voltage US. After subtraction of the components IR and IC the polarization component IP is left: IP=IS–IR–IC=(dP/dt). This component is equal to the time derivative of the polarization P in the ferroelectric material.

In the course of this process, the variations of the polarization component IP which depend on the applied voltage US are displayed as a hysteresis loop (30) on the screen (2) of the microcomputer (1). This loop has two symmetric peaks with respect to the origin as shown in the diagram of FIG. 3. The value of the polarization P is calculated by integrating the current IP, and its voltage-dependent variations are also displayed on the screen (2) as a hysteresis loop (31). By observing the loops (30, 31) being displayed it can be ensured that they have stabilized at the end of the process. If the voltage US is removed, a residual polarization PR is left in the zone covered by the electrodes (10, 11) on the foil (100) which is indicated in FIG. 3.

If the polarization is terminated—as indicated either by using measurement electrodes according to one of the usual methods or external electrodes according to the method described above—, the depolarization can be performed according to the method of the invention.

The facility shown in FIG. 2 or any other equivalent facility can be used for this purpose.

An ac voltage of very low frequency is applied across the electrodes (10, 11) which—as has been mentioned before— can serve as measurement or as external electrodes. This voltage produces an electric field in the material whose amplitude is inversely proportional to the material's thickness and directly proportional to the amplitude of the applied voltage. The selected amplitude of this electric field shall exceed the value of the coercive field $E_c$.

The frequency selected for the ac voltage is typically below 1 Hz with a preferential value in the range of 0.0001 Hz to 1 Hz. As in the polarization phase the voltage is generated by the generator (4) and amplified by the amplifier (5) and all processes are controlled by the circuit card (3).

The current flow within the material is measured and converted to digital signals by the A/D converter (6).

The signals U and UIS are processed by the circuit card (3) so that a display can be presented similar to that obtained during the polarization phase.

In a preferred variant of the procedure according to the invention the amplitude of the voltage US is chosen in such a way that the initial maximum amplitude of the electric field exceeds the value of approximately $1.30 \times E_c$, $1.35 \times E_c$ can be adopted. This value is of course dependent on the slope of the i. e. it exceeds the value $E_c$ by approximately 30%. Favourably, the value of hysteresis loop near the coercive field $E_c$ und thus on the material used.

Then the amplitude of the electric field is decreased in decrements or steps which is one of the important characteristics of the depolarization procedure. The value of this decrement depends on the nature of the material to be depolarized and on its thickness. Taking the example of PVDF the value of the decrement is approximately 1 V/µm. However, this is no critical value and it can typically be selected from a range between 0.5 and 1.5 V/µm.

Depending on the degree of depolarization (partial or complete) the process is continued until the amplitude of the electric field attains a predetermined value (partial depolarization) or equals zero (complete depolarization).

Considering an orthonormal system of coordinates in which one of the axes is perpendicular to the surface of the support (100), i. e. parallel to the applied electric field, it can be stated that the polarization of the material equals zero along the said axis which is perpendicular to the surface of the support.

Along this axis the material no longer exhibits any piezoelectric effect. But in general the effect is not completely zeroized along the two other axes, i.e. those in parallel to the surface of the support (100).

To illustrate the underlying ideas of this invention, FIG. 4 presents characteristic hysteresis loops of a real case according to a test performed by the applicant. In this figure two sets of loops are shown: those representing the current (in µA) which flows through the material as a function of the applied field (expressed in kV) and those representing the polarization (in µC/cm$^2$) as a function of the applied field.

This diagram assumes a complete depolarization of the material. Only one loop out of four is represented in the figure in order to obtain a distinct representation.

The example illustrated in FIG. 4 is based on the following data:
  material: . PVDF film
    . thickness: 25 µm
    . area of the polarized film: 0.09 cm$^2$
  applied voltage: . sinusoidal
    . frequency: 0.5 Hz
    . maximum initial amplitude: 10 kV
    . decrease in steps of 25 V FIG. 5 illustrates a partial depolarization. The initial numerical data are the same as before, but the process of decreasing the applied voltage was stopped before the voltage equalled zero. As a result there is a residual polarization P=4.6969 μC/cm² for a coercive field equal to 1.5934 kV.

As has been mentioned before the invention can advantageously be used for a selective depolarization of a polarized material. From the case of a complete depolarization of certain zones or regions of this material it follows inversely that certain zones can be polarized selectively.

This possibility offered by the invention will now be explained in more detail with reference to FIGS. 6 to 8.

Figure 6:
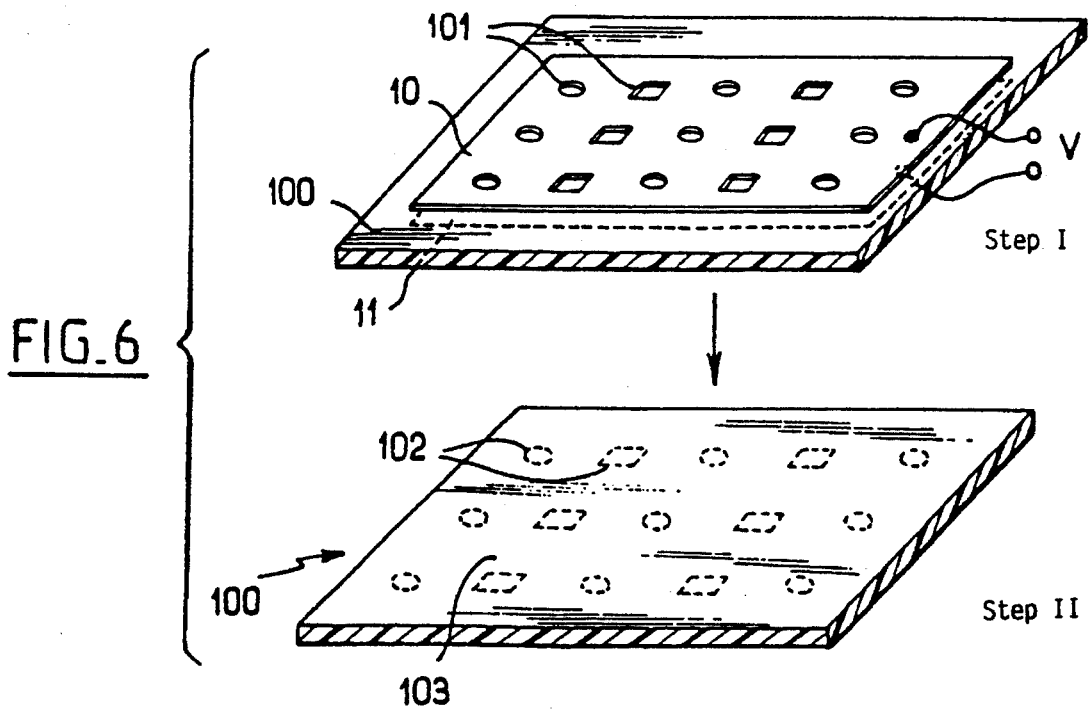
FIG. 6 illustrates in a schematic way the selective depolarization of a ferroelectric material according to the method of the invention.

A foil or a film (100) serves as initial material whose thickness is small in comparison with its other dimensions as is shown schematically in FIG. 6. It is assumed that this film which contains no electrodes has been polarized before across its whole area using the method mentioned above. In the following this material will be designated as "prepolarized material".

It is also assumed that it is desirable to preserve polarized zones which are distributed according to a regular, matrix-like configuration, these zones being alternatively circular or square. Of course, this special configuration has only been chosen to better illustrate the invention, any other configuration can also be adopted according to the planned application.

In a first step a pair of electrodes (10, 11) is installed on either side of the polarized film (100). To achieve the desired selective depolarization of the material one of the electrodes, e.g. electrode (10), has a special configuration as shown in FIG. 6. It contains circular and square holes (101) distributed according to the said regular matrix configuration. The potential difference V which is a decreasing ac voltage is applied to these electrodes according to step I of the method of the invention.

At the end of step I the electrodes (10, 11) are removed and the ferroelectric film (100) is now depolarized across the whole area (103) that was enclosed before by the surface of the electrode (11) and the solid regions of the electrode (10) (step II).

In the area which had been covered before by the two electrodes remain elementary regions (102) which can be designated as pixels in the illustrated example due to their small dimensions. These pixels have substantially the same circular or square form as the holes in the electrode (10) and are distributed in the same way across the surface of the foil (100). The roles of the two electrodes can of course be exchanged.

FIG. 7 schematically illustrates the succession of the two types of regions (102, 103) with region (102) remaining polarized.

As has been mentioned before it should be noted that the polarization in the depolarized regions (103) equals zero along an axis perpendicular to the surface of the film, and thus the material of these regions no longer reacts along this axis.

Depending on whether the material is drawn in one or two directions along the two other axes of the orthonormal system of coordinates, there is still a response along one axis or both axes. In FIG. 7 these states are symbolized by arrows.

Thus piezoelectric elements with three-, two- or one-dimensional response can be obtained using the method of the invention.

The selective depolarization method which has just been described offers a certain number of advantages.

The initial maximum value of the electric depolarization field preferentially exceeds the coercive field by 30%, but this value may change which is especially due to the slope of the hysteresis loop of a specific material.

The edge effects are minimal.

Consequently the distance between depolarized zones may be very short: typically 40 μm or less for a film having a thickness of 25 μm. Cross-coupling is minimal.

The remaining polarized surfaces have a precise geometrical form. Primarily this precision depends only on the precise arrangement of the electrodes, and this does not present any particular difficulties.

In conformity with one of the aspects of the invention another variant which is illustrated schematically in FIG. 8 offers the possibility to depolarize the regions (103) only partially. The remanent polarization of these regions equals $P_1$ and that of the regions (102) equals P with P and $P_1$ satisfying the following relation: $P>P_1>0$.

Finally, there is a supplementary variant not shown here using an electrode, as for example electrode (10), which is divided into electrically insulated portions. The process of decreasing the electric field is stopped at various levels for each electrode portion so that distinct regions of the foil (100) can be obtained which are in different depolarization states and can possibly coexist with completely depolarized regions, if required.

These possibilities of selective depolarization offered by the method of the invention are advantageously used to produce different kinds of sensors (piezoelectric, pyroelectric sensors) as well as medical imaging devices.

In this last case annular structures can be constructed surrounding a central circular zone in such a way as to eliminate the side lobes.

The construction of a pressure sensor using the method according to the invention will now be described with reference to FIG. 9.

The process starts (step 0) with a ferroelectric foil (100) with at least one prepolarized region (104) which is shown as a hatched area in FIG. 9. The dimensions of the foil and the nature of the material are selected in conformity with the planned application. This aspect does not differ from known techniques.

As before a pair of electrodes (20, 21) is installed on either side of the foil (100) covering the region (104) (step I). In this case it is assumed that a polarized region having a circular form shall be obtained at the end of this step. For this purpose one of the electrodes (20) contains a circular hole of the required diameter.

The method of the invention is now performed by applying a decreasing ac voltage across the electrodes (20, 21).

To illustrate the underlying ideas of this invention, it is assumed that the material used is PVDF with a thickness of 25 μm. The values which had already been defined in connection with the description of the diagram in FIG. 4 can therefore be adopted.

Following this step, only one region (105) of circular form remains polarized (step II).

In a later step (step III) measurement electrodes (30, 31) can be installed on either side of the foil (100). These electrodes shall cover the region (105). They can be installed by any known procedure: metallization etc.

One of the interesting possibilities offered by the invention is to take advantage of the direction of polarization of the material to produce balanced gages.

Such a gage is schematically illustrated in FIG. 10. To produce this gage a foil of ferroelectric material (100) can be used which has two distinct regions, one was polarized perpendicular to the surface, but along a first direction and the other along a second direction. This result can be achieved by performing two distinct steps or by using two separate pairs of polarization electrodes covering selectively the said regions.

Then the material is depolarized in conformity with the method of the invention, i.e. in the same way as has been described in connection with FIG. 6 or 9 (step I).

Following this step, there are only two polarized regions left with opposite directions of polarization. These are marked by the "+" and "−"-symbols in FIG. 10. Two pairs of measurement electrodes (40 and 41, 50 and 51) are installed on the foil (100) to cover the polarized zones, i.e. the zones which remained polarized after depolarization.

As mentioned before, the method of the invention can also be used to obtain materials with reinforced dielectric strength.

Surprisingly enough it was observed that a ferroelectric material of the PVDF type which was polarized and then depolarized by application of an electric field according to the method of the invention had a dielectric strength exceeding that of the initial material by at least 50%.

The experiment was made using a film of PVDF with a thickness of 25 µm and a surface area of 10 cm².

The initial dielectric strength measured according to commonly authorized standards was 7 kV.

After depolarization of the material in conformity with the method of the invention the dielectric strength measured according to the same standards exceeded 10 kV.

Other tests with various dielectric materials have also been confirming.

Hence, the method according to the invention is particularly interesting if materials for various electronic components shall be obtained, especially materials needed for the manufacture of capacitors for which voltage breakdown characteristics are particularly important.

Of course, the invention is not limited to these precisely described examples. Although PVDF is the material which is currently used for this type of application, other materials showing ferroelectric effects can likewise be used as has been mentioned before, for example the copolymers P(VDF-TrFe) etc.

Finally numerous variants of the electric depolarization facility are conceivable depending on the specialist's state of knowledge.

I claim:

1. Method of depolarizing a ferroelectric material using electrical means, said material having been pre-polarized along a specific axis in at least one of its regions during a preceding phase; said method comprising the steps of:

applying a low-frequency alternating electric field to said material with the maximum amplitude of the field exceeding the coercive polarization field ($E_c$) of the said material parallel to a specific axis;

effecting a step-by-step decrease of the said amplitude to a specific minimum value of the amplitude of the applied electric field so that a predetermined value of residual polarization of said material is achieved; and displaying residual polarization values of said material at each step of said step-by-step decrease, and comparing said displayed values to said predetermined value;

whereby said predetermined value of residual polarization can be reproducibly achieved for a plurality of said ferroelectric materials, and whereby an increased dielectric strength can be imparted to said ferroelectric materials.

2. Method as claimed in claim 1 wherein said specific minimum value of the amplitude of the electric field equals zero so that said material is completely depolarized.

3. Method as claimed in claim 1 wherein only particular zones of each polarized region of said material are exposed to the low-frequency alternating electric field so that they are completely or partially depolarized while there is at least one polarized zone left.

4. Method as claimed in claim 1 wherein the maximum amplitude of the alternating electric field is chosen in such a way that its value is approximately 1.3 times the value of the coercive field ($E_c$).

5. Method as claimed in claim 1 wherein said material is located between at least one pair of electrodes and wherein said electric field is established by applying a low-frequency AC voltage across said electrodes; the amplitude of this voltage being decreased step by step so that a correlative decrease of said electric field is achieved.

6. Method as claimed in claim 5 wherein one of said electrodes of each pair of electrodes is equipped with at least one hole so that a polarized zone opposite this hole is left on said material, the other zones covered by the electrode being completely or partially depolarized.

7. Method as claimed in claim 6 wherein one of said electrodes of each pair of electrodes comprises several holes.

8. Method as claimed in claim 1 wherein the ferroelectric material is crystalline or polycrystalline.

9. Method as claimed in claim 1 wherein the ferroelectric material is a polymer or copolymer.

10. Method as claimed in claim 8 wherein said ferroelectric material is made of PVDF or the copolymer $VF_2/VF$.

11. Method as claimed in claim 10 wherein said low frequency is selected from the range between 0.0001 Hz and 1 Hz and that said voltage step is selected from the range between 0.5 V and 1.5 V for each micrometer thickness of the said material.

* * * * *